(12) United States Patent
Tack et al.

(10) Patent No.: US 11,244,977 B2
(45) Date of Patent: Feb. 8, 2022

(54) IMAGING SENSOR

(71) Applicant: IMEC VZW, Leuven (BE)

(72) Inventors: Nicolaas Tack, Leuven (BE); Bert Geelen, Leuven (BE); Bart Vereecke, Leuven (BE)

(73) Assignee: IMEC VZW, Leuven (BE)

( * ) Notice: Subject to any disclaimer, the term of this patent is extended or adjusted under 35 U.S.C. 154(b) by 160 days.

(21) Appl. No.: 15/846,584

(22) Filed: Dec. 19, 2017

(65) Prior Publication Data

US 2018/0182798 A1 Jun. 28, 2018

(30) Foreign Application Priority Data

Dec. 23, 2016 (EP) .................................... 16206580

(51) Int. Cl.
| | |
|---|---|
| *H01L 27/146* | (2006.01) |
| *G01J 3/02* | (2006.01) |
| *G01J 3/28* | (2006.01) |
| *G01J 3/26* | (2006.01) |
| *G01J 1/42* | (2006.01) |

(52) U.S. Cl.
CPC ...... *H01L 27/14623* (2013.01); *G01J 1/4228* (2013.01); *G01J 3/0229* (2013.01); *G01J 3/26* (2013.01); *G01J 3/2803* (2013.01); *H01L 27/1464* (2013.01); *H01L 27/14607* (2013.01); *H01L 27/14621* (2013.01); *H01L 27/14643* (2013.01)

(58) Field of Classification Search
CPC ......... H01L 27/14623; H01L 27/14607; H01L 27/14621; H01L 27/1464; H01L 27/14643; G01J 1/4228; G01J 3/0229; G01J 3/26; G01J 3/2803
See application file for complete search history.

(56) References Cited

U.S. PATENT DOCUMENTS

| | | | |
|---|---|---|---|
| 6,429,036 B1 | 8/2002 | Nixon et al. | |
| 7,038,184 B2 | 5/2006 | Chang | |

(Continued)

FOREIGN PATENT DOCUMENTS

| | | |
|---|---|---|
| FR | 2926635 A1 | 7/2009 |
| WO | WO-2009/102328 A1 | 8/2009 |

OTHER PUBLICATIONS

Shaner et al., "Plasmonic Filters," 2009.

(Continued)

*Primary Examiner* — Georgia Y Epps
*Assistant Examiner* — Don J Williams
(74) *Attorney, Agent, or Firm* — Moser Taboada (57) ABSTRACT

An imaging sensor comprises: an array of light-detecting elements, wherein each light-detecting element in the array of light-detecting elements is arranged in the imaging sensor so as to detect a respective wavelength interval, wherein the respective wavelength interval differs for different light-detecting elements; a pattern arranged on the array of light-detecting elements, wherein the pattern defines a plurality of transparent areas, each transparent area being associated with a corresponding light-detecting element in the array of light-detecting elements, wherein a size of a transparent area among the plurality of transparent areas is dependent of the corresponding light-detecting element with which the transparent area is associated.

19 Claims, 4 Drawing Sheets

(56) References Cited

U.S. PATENT DOCUMENTS

| | | | |
|---|---|---|---|
| 8,314,866 B2 | 11/2012 | Massetti | |
| 8,940,574 B2 | 1/2015 | Wang et al. | |
| 2008/0303919 A1* | 12/2008 | Egawa | H04N 5/23212 348/223.1 |
| 2010/0084728 A1* | 4/2010 | Yamada | H01L 27/14868 257/432 |
| 2012/0274834 A1* | 11/2012 | Gidon | H01L 27/14621 348/345 |
| 2015/0229851 A1* | 8/2015 | Nystrom | G01J 3/26 348/342 |
| 2015/0355026 A1 | 12/2015 | Iguchi et al. | |

OTHER PUBLICATIONS

Tokuda et al., "Polarisation-Analysing CMOS Photosensor with Monolithically Embedded Wire Grid Polariser," Electron. Lett., vol. 45, Issue 4, pp. 228-230, 2009.

Wang et al., "Light Field Image Sensors Based on the Talbot Effect," Appl. Opt., vol. 48, Issue 31, p. 5897, Nov. 2009.

Qin, "Hyperspectral Imaging Instruments," in Hyperspectral Imaging for Food Quality Analysis and Control, D.-W. Sun, Ed. Elsevier, Chapter 5, 2010.

Wang et al., "An 89db Dynamic Range CMOS Image Sensor with Dual Transfer Gate Pixel," in International Image Sensor Workshop, p. R36, 2011.

Tack et al., "A Compact, High-Speed, and Low-Cost Hyperspectral Imager," in Proc. SPIE 8266, Silicon Photonics VII, vol. 8266, p. 82660Q, 2012.

Yokogawa et al., "Plasmonic Color Filters for CMOS Image Sensor Applications," Nano Lett., vol. 12, Issue 8, pp. 4349-4354, Aug. 2012.

Zhang et al., "A Monolithic CMOS Image Sensor with Wire-Grid Polarizer Filter Mosaic in the Focal Plane," IEEE Trans. Electron Devices, vol. 61, Issue 3, pp. 855-862, 2014.

Lambrechts et al., "A CMOS-Compatible, Integrated Approach to Hyper- and Multispectral Imaging," in 2014 IEEE International Electron Devices Meeting, pp. 10.5.1-10.5.4, 2014.

Yoon et al., "Hyperspectral Image Processing Methods," in Hyperspectral Imaging Technology in Food and Agriculture, B. Park and R. Lu, Eds. Springer, Chapter 4, 2015.

Minotti, "Evaluation of the Signal-To-Noise Ratio in a Typical Active Pixel of a CMOS Image Sensor.," 2016. http://risorse.dei.polimi.it/sensorlab/MEMS_microsensors/Exercises/E16.pdf. [Accessed: Aug. 24, 2016].

Andor, "Dual Amplifier Dynamic Range", http://www.andor.com/learning-academy/dual-amplifier-dynamic-range-scmos-dynamic-range. [Accessed: Aug. 26, 2016].

"Center Filters for Wide Angle Lenses", http://www.kenrockwell.com/tech/center-filters.htm.

Extended European Search Report for Application No. EP 17205057, dated May 9, 2018.

* cited by examiner

IMAGING SENSOR

CROSS-REFERENCE TO RELATED APPLICATIONS

This application claims priority to and the benefit of European Patent Application No. 16206580.9, filed on Dec. 23, 2016, the disclosure of which is incorporated herein by reference in its entirety.

BACKGROUND

Field of the Invention

The present invention relates to an imaging sensor. The present invention also relates to a system including the imaging sensor and to the use of the imaging sensor. In particular, the present invention relates to an imaging sensor arranged to provide an even signal from the light-detecting elements of the imaging sensor.

Description of the Related Art

Spectral imaging implies that spectral content of an image of an object is extracted and incident light on an imaging sensor relating to multiple ranges of wavelengths is detected. The spectral imaging may for instance be used in analysis of imaged objects, such as for determination whether a substance having a specific spectral profile is present in the object.

The terms multi-spectral imaging and hyperspectral imaging are often used. These terms do not have established definitions, but typically multi-spectral imaging refers to spectral imaging using a plurality of discrete wavelength bands, whereas hyperspectral imaging refers to imaging narrow spectral wavelength bands over a continuous spectral range. Hyperspectral imaging may also often use a larger number of spectral bands than what is used in multi-spectral imaging.

It is commonly desired that spectral imaging is performed for each part of an object. Thus, image data may need to be gathered in three dimensions, two spatial dimensions combined with a spectral dimension. This implies that large amounts of image data need to be gathered and sets requirements on an imaging device for gathering the image data.

The imaging sensor may comprise an array of light-detecting elements, which may detect an intensity of light incident on the light-detecting elements. The imaging sensor may further comprise one or more filters for controlling a wavelength being transmitted to the light-detecting element.

The array of light-detecting elements may be formed as an array of photodiodes in a complementary metal-oxide-semiconductor (CMOS) device. Thus, for ease of manufacture, the light-detecting elements may be identical regardless of which wavelength the light-detecting element is to detect. Then, filters may be arranged on or in relation to the array for controlling which wavelength each light-detecting element will detect.

However, a spectral response of photodiodes varies with wavelengths. Thus, the strength of the signal of recorded image information is dependent on wavelength.

With a common exposure time the well capacity of photodiodes in the spectral bands with low sensitivity may be sub-optimally used, while in photodiodes in the spectral bands with high sensitivity the well capacity may be overflowed. As a consequence, the signal to noise ratio (SNR), the spatial resolution, the contrast (i.e. a ratio of largest and smallest value of light-induced measurements in the light-detecting elements) and the dynamic range (i.e. a ratio of largest and smallest value of detected light intensity that a photodiode is able to record without saturation) of recorded image information is dependent on wavelength.

With short exposure times, the SNR, the spatial resolution and contrast of the image is higher in spectral bands where the sensitivity is high, as only a small intensity of light may be required in order to induce a measurement in the light-detecting element that is above a noise floor. With increased exposure time, a saturation may occur for photodiodes in the spectral band having high sensitivity which implies that the spatial resolution and contrast for these spectral bands decrease, while the spatial resolution and contrast improves in the spectral bands with low sensitivity. Hence, it is difficult to image an object with adequate SNR, spatial resolution, contrast and dynamic range in several spectral bands.

In U.S. Pat. No. 8,314,866, a color pixel array including a plurality of micropixels is disclosed. The size and shape of the micropixels varies among the plurality of micropixels, such that a size of a photo-sensitive area may differ for different wavelengths. However, this color pixel array requires a complex structure of differently shaped micropixels, which may be difficult to manufacture or at least require very accurate control of a manufacturing process.

SUMMARY

An objective of the present inventive concept is to provide an improved imaging sensor. It is a particular objective of the present inventive concept to provide an imaging sensor which may acquire images with high SNR, spatial resolution, contrast and/or dynamic range for a plurality of spectral bands.

These and other objectives of the present inventive concept are at least partially met by the invention as defined in the independent claims. Preferred embodiments are set out in the dependent claims.

According to a first aspect, there is provided an imaging sensor, comprising: an array of light-detecting elements, wherein each light-detecting element in the array of light-detecting elements is arranged in the imaging sensor so as to detect a respective wavelength interval, wherein the respective wavelength interval differs for different light-detecting elements; a pattern arranged on the array of light-detecting elements, wherein the pattern defines a plurality of transparent areas, each transparent area being associated with a corresponding light-detecting element in the array of light-detecting elements, wherein a size of a transparent area among the plurality of transparent areas is dependent of the corresponding light-detecting element with which the transparent area is associated.

Thanks to the invention, the pattern allows controlling of a size of a transparent area associated with a light-detecting element in an array. Thus, the pattern may ensure that an amount of light and/or a direction of light reaching the light-detecting element is controlled. The pattern may be arranged to block some of the light that is incident on the imaging sensor. However, the blocking of the light may ensure that the imaging sensor as a whole makes full use of the light of different wavelengths and/or from different directions.

Thus, the pattern may associate a small transparent area with a light-detecting element being arranged to detect a wavelength for which the light-detecting element has a high spectral response, whereas the pattern may associate a large transparent area with a light-detecting element being arranged to detect a wavelength for which the light-detecting element has a low spectral response. Hence, the blocking of light that is to reach the light-detecting element with a high spectral response ensures that this light-detecting element will not be saturated. Thus, a longer exposure time may be used while not saturating the light-detecting elements with a high spectral response, such that the longer exposure time may allow acquiring an image with high SNR, spatial resolution, contrast and/or dynamic range also in a spectral band for which the light-detecting elements have a low spectral response.

According to the invention, the array of light-detecting elements may comprise identical light-detecting elements throughout the array, which makes manufacture of the array relatively simple. Thanks to the invention, such a simple arrangement of an array of light-detecting elements may be used while allowing an image with high SNR, spatial resolution, contrast and/or dynamic range over a large spectral range to be acquired. Thus, a complex arrangement of filters and/or layout of light-detecting elements may not be needed in order to provide a high SNR, spatial resolution, contrast and/or dynamic range.

The pattern may be formed as one or more layers arranged on the array in one or more materials, wherein the pattern defines transparent areas. The transparent areas may be openings in a material of the pattern, such that the transparent areas may be defined by lines or shapes of the material between the openings. However, it should also be understood that the pattern may be formed of at least two different materials, wherein a transparent material is used in the transparent areas and an opaque material is used between the transparent areas. In an embodiment, the pattern may be formed as a mesh or grid of interconnected lines of material forming separate areas between the lines.

As also described below, the pattern may comprise "islands" or separate transparent areas (possibly openings in the pattern), each being surrounded by an opaque or at least non-transparent material, which could be connected over the pattern to form a mesh or grid. However, the pattern may alternatively comprise "islands" or separate areas of opaque material, each being surrounded by a transparent material. Further, other configurations of the pattern may be contemplated. For instance, an "island" or separate blocking area could be surrounded by a frame forming a transparent area. The transparent area frames could in turn be separated by interconnected lines forming a mesh or grid of blocking areas.

A shape of a transparent area may be quadratic or rectangular, which may be advantageous as the pattern may have a relatively regular shape. However, other shapes of the transparent area may also be contemplated, such as triangular or circular, or a more complex shape.

In other words, there is provided an imaging sensor, comprising: an array of light-detecting elements, wherein a first light-detecting element in the array of light-detecting elements is arranged in the imaging sensor so as to detect wavelengths in a first interval of wavelengths and second light-detecting element in the array of light-detecting elements is arranged in the imaging sensor so as to detect wavelengths in a second interval of wavelengths different from the first interval of wavelengths; a pattern arranged on the array of light-detecting elements, wherein the pattern defines a first transparent area associated with the first light-detecting element and a second transparent area associated with a second light-detecting element, wherein the first and second transparent areas are transparent for the first and second interval of wavelengths, respectively, and a size of the first transparent area differs from a size of the second transparent area.

The imaging sensor may be arranged to gather image data in three dimensions (two spatial dimensions and a spectral dimension) in a single exposure. This may be achieved by the imaging sensor having a mosaic configuration, wherein the imaging sensor is divided into identical sub-groups of light-detecting elements repeated over an array of light-detecting elements and wherein a filter is provided such that a plurality of unique wavelength bands is transmitted to the light-detecting elements in the sub-group. Thus, each image point (made up by a single sub-group) has a spectral resolution defined by the wavelength bands detected in the sub-group.

An imaging system may alternatively comprise an optical duplicator, which is arranged to duplicate an image of an object onto several different portions of the imaging sensor. The imaging sensor may then comprise a tiled configuration, wherein each tile defines a group of light-detecting elements and the light-detecting elements of a group are arranged to detect a unique wavelength band. Thus, each tile may acquire an image of the object in a unique wavelength band and the spectral resolution of the imaging sensor is defined by the wavelength bands of the different groups.

An imaging system may alternatively be arranged to scan an image of an object over lines of the light-detecting elements of the imaging sensor. Each line may be arranged to detect a unique wavelength band and as the object has been scanned over all lines, an image with spectral resolution given by the wavelength bands detected by different lines of the imaging sensor may be formed.

According to an embodiment, the sizes of the transparent areas are dependent on a sensitivity of the corresponding light-detecting element to the respective interval of wavelengths detected by the light-detecting element. This implies that the size of the transparent area may be set such that a small transparent area may be associated with a light-detecting elements being arranged to detect a wavelength for which the light-detecting element has a high sensitivity while a large transparent area may be associated with a light-detecting element being arranged to detect a wavelength for which the light-detecting element has a low sensitivity. Thus, a difference in sensitivity of the light-detecting elements may be equalized by the difference in sizes of the transparent areas.

According to an embodiment, an illumination source may also be known, e.g. if sunlight is used as an illumination source. Thus, an amount of light of a respective wavelength will also be known. This implies that the size of the transparent area may also take the amount of incoming light for different wavelengths into account so that an equal SNR, spatial resolution, contrast and/or dynamic range over a range of wavelengths detected by the imaging sensor may be achieved.

According to an embodiment, a first light-detecting element having a smallest sensitivity for the respective interval of wavelengths is used for defining a maximum size of the transparent area of the pattern, and wherein the transparent areas of other light-detecting elements are smaller than the maximum size and designed in relation to an imaging parameter for the first light-detecting element.

This implies that the pattern may be arranged such that the transparent area is arranged to correspond to an entire size of the light-detecting element having a smallest sensitivity for the wavelength being detected by the light-detecting element. Thus, no blocking of light is applied to the wavelength for which a smallest sensitivity exists, such that the lowest light intensity required for the signal to be above a noise floor is not further lowered for this smallest sensitivity wavelength. Hence, the detected signals based on light intensity for all other wavelengths may be adapted to the sensitivity of the smallest sensitivity wavelength. The imaging parameter of the first light-detecting element that is considered when designing a size of the transparent area for other light-detecting element may thus be any one (or a plurality of) a SNR, spatial resolution, contrast and dynamic range. In one embodiment, the size of the transparent area for other light-detecting elements is set so that the imaging parameter is equal for the light-detecting elements.

According to an embodiment, the pattern comprises blocking areas between the transparent areas, wherein a blocking area at least partially overlaps a light-detecting element so as to limit a portion of the light-detecting element which will receive light through the pattern. The blocking area may thus be arranged to limit an amount of light that will reach the light-detecting element by means of the blocking area overlapping the light-detecting element.

According to an embodiment, the blocking areas of the pattern are interconnected and the pattern further defines separate transparent areas separated by portions of the blocking areas, wherein each separate transparent area is arranged on the corresponding light-detecting element.

Thus, the light-detecting element may receive light merely at a central part of the light-detecting element, defined by the transparent area. This implies that an area of each light-detecting element in which light will actually be detected is clearly separated from a corresponding light-detecting area of an adjacent light-detecting element. This implies that there is a low risk of cross-talk between the light-detecting elements.

According to an embodiment, the transparent areas of the pattern are interconnected and the pattern further defines separate blocking areas separated by portions of the transparent areas, wherein each separate blocking area is arranged on the corresponding light-detecting element. This implies that light incident on the light-detecting element with a small angle may be blocked, whereas light incident on the light-detecting element at a larger angle will be transmitted to the light-detecting element. Hence, the imaging sensor may be arranged to reduce a vignetting effect, i.e. that a brightness of an acquired image is reduced at edges of the image due to light being incident on the imaging sensor at different angles.

According to an embodiment, wherein the blocking areas are formed of a material which is opaque to wavelengths of light over a total range of wavelengths spanning the wavelength intervals of the array of light-detecting elements. This implies that the blocking areas may be arranged to completely block light over the total range of wavelengths being detected by the light-detecting elements. Hence, the same material of the blocking areas may be used throughout the pattern and the blocking areas may have an equal effect on blocking light for all light-detecting elements.

However, although a completely opaque material may be simplest to use in that the light reaching the light-detecting elements through the pattern is well-controlled, it should be realized that the material of the blocking areas need not be completely opaque. The material may be arranged to block some light by partially absorbing or reflecting light, while also transmitting some light through the blocking area. Thus, an intensity of light incident on the blocking area may be reduced before reaching the light-detecting element.

According to an embodiment, the blocking areas are formed of a material having an equal, or at least substantially equal, transmittance of light over the total range of wavelengths spanning the wavelength intervals of the array of light-detecting elements. According to yet another embodiment, the blocking areas may have a differing transmittance for different wavelengths. In such case, the size of the transparent areas may also take into account a transmittance of the blocking area associated with a respective light-detecting element.

According to an embodiment, the imaging sensor comprises a filter arranged on the array of light-detecting elements for controlling the respective wavelength interval being detected by the light-detecting elements. Thus, the filter controls the wavelength being detected by each light-detecting element. The pattern may be arranged on the filter, such that the amount of light incident on the filter may be adapted to the sensitivity of the light-detecting element given by the filter.

According to an embodiment, the filter comprises Fabry-Perot optical filters being selective to a narrow wavelength interval, wherein a Fabry-Perot optical filter is arranged on each of the light-detecting elements. The Fabry-Perot optical filter may thus individually control the wavelength interval being detected by each light-detecting element. Each of the wavelength intervals may thus be a narrow wavelength interval, such as having a full-width at half maximum of e.g. 15 nm.

According to an embodiment, the filter defines a large number of different wavelength intervals, such as at least four or at least eight, to be detected by the light-detecting elements.

For instance, the use of Fabry-Perot optical filters allows detecting a large number of different wavelength intervals. This implies that the pattern may be advantageously used on a layer providing Fabry-Perot optical filters on the light-detecting elements for controlling an amount of light that reaches the light-detecting elements depending on the wavelength that will be detected by the respective light-detecting element.

According to an embodiment, the imaging sensor is arranged for backside illumination. With backside illumination, a larger amount of light may be received compared to front side illumination. As the imaging sensor is arranged to reduce light received by the light-detecting elements, in order to e.g. equalize a SNR over an entire spectrum of detected wavelengths, it may be desired that as little light as possible is lost in interaction with other layers of the imaging sensors.

According to an embodiment, the pattern defines a blocking area corresponding to each light-detecting element, and wherein the blocking area is arranged to block light rays incident on the light-detecting element at smallest angles in relation to a normal to the light-detecting element and wherein a size of the blocking area is dependent of the corresponding light-detecting element with which the blocking area is associated. This may be useful in reduction of a vignetting effect, i.e. that a brightness of an acquired image is reduced at edges of the image due to light being incident on the imaging sensor at different angles. By means of the blocking area being arranged to block light rays incident at small angles, the difference in brightness at different parts of the array may be reduced.

According to an embodiment, a position of a center of a blocking area or transparent area may be displaced in relation to a center of the light-detecting element. The positioning of the blocking area or transparent area in relation to the center of the light-detecting element may be used for fine-tuning a spectral response of the light-detecting element because the wavelengths of light reaching the light-detecting element depends on an angle of incidence of light. The tuning of the spectral response may also function as normalizing spectral sampling by the array of light-detecting elements, when a sampling step between adjacent wavelength intervals detected by different light-detecting elements is otherwise not uniform.

According to an embodiment, transparent areas of the pattern are interconnected and the pattern further defines separate blocking areas separated by portions of the transparent areas, wherein each separate blocking area is arranged on the corresponding light-detecting element and wherein the blocking area on a light-detecting element at a center of the array is larger than the blocking area on a light-detecting element at an edge of the array. By means of the blocking area being larger at a center of the array compared to the blocking area at the edge of the array, intensity of light at the center of the array (where light is incident on the light-detecting element at a small angle) is reduced.

According to another embodiment, the blocking area on a light-detecting element at a center of a row in the array may be larger than the blocking area at an edge of the row. Further, a varying of a size of the blocking areas in one row may be repeated for other rows in the array. This implies that a relation between size of blocking areas on light-detecting elements at a center of a row and at edges of the row may be equal for many, or even all, rows in the array. Such a configuration may be relatively simple to arrange on the array and may be especially relevant for a line-scanning operation of the imaging sensor. Thus, the row may extend in a direction perpendicular to a scanning movement direction.

According to an embodiment, a position of the blocking area in relation to the light-detecting element may differ at the center of a row in the array and at the edge of the row in the array. At the center of the array, e.g. at the center of a row of the array, the smallest angle of light rays incident on the light-detecting element will be at the center of the light-detecting element, such that the blocking area may be arranged at a center of the light-detecting element. However, at an edge of the array, e.g. at the edge of the row of the array, the smallest angle of light rays incident on the light-detecting element may be at an edge of the light-detecting element closest to the center of the array, such that the blocking area may be asymmetrically arranged in relation to the light-detecting element depending on a distance from the light-detecting element to the center of the array.

According to an embodiment, the array of light-detecting elements is a two-dimensional array. This implies that the array of light-detecting elements may be arranged to detect information in at least two dimensions simultaneously, e.g. one spatial dimension and one spectral dimension or two spatial dimensions.

According to a second aspect, there is provided a system for imaging, comprising: an optical system for forming an image onto an image plane; and an imaging sensor according to the first aspect arranged in the image plane to acquire an image of an object.

Effects and features of this second aspect are largely analogous to those described above in connection with the first aspect. Embodiments mentioned in relation to the first aspect are largely compatible with the second aspect.

The system may thus make use of the imaging sensor in order to enable acquiring of an image of an object with a high SNR, spatial resolution, contrast and/or dynamic range.

According to an embodiment, the sizes of the transparent areas of the imaging sensor are designed in relation to a spectral profile of an illumination source. In some applications, e.g. satellite application, a complete system including the spectral profile of the illumination source may be known at the design phase. For instance, in satellite applications, it is known that the spectral profile of the illumination will be the spectral profile of the sun. Thus, the transparent areas may be designed such that a constant signal-to-noise ratio will be achieved over all detected wavelengths, as a variance in intensity of light for different wavelengths as well as a variance of a spectral response of the light-detecting elements may be known. In such case, the system may be adapted to use with the specific illumination source and the system may not function as well if a different illumination source is used.

The system may also comprise the illumination source, which may e.g. be used for providing illumination in an otherwise dark space, such as in an endoscopy application. In such case, a spectral profile of the illumination source will be known and the system may be well adapted to imaging using the illumination source that is a part of the system.

According to a third aspect, there is provided use of an imaging sensor according to the first aspect for acquiring an image having a constant imaging parameter over a range of wavelengths spanning the wavelength intervals of the light-detecting elements.

Effects and features of this third aspect are largely analogous to those described above in connection with the first and second aspects. Embodiments mentioned in relation to the first and second aspects are largely compatible with the third aspect.

The imaging parameter may be one or more of a SNR, spatial resolution, contrast and dynamic range.

BRIEF DESCRIPTION OF THE DRAWINGS

The above, as well as additional objects, features and advantages of the present inventive concept, will be better understood through the following illustrative and non-limiting detailed description of preferred embodiments of the present inventive concept, with reference to the appended drawings. In the drawings like reference numerals will be used for like elements unless stated otherwise.

DETAILED DESCRIPTION

Detailed embodiments of the present invention will now be described with reference to the drawings.

Figure 1:
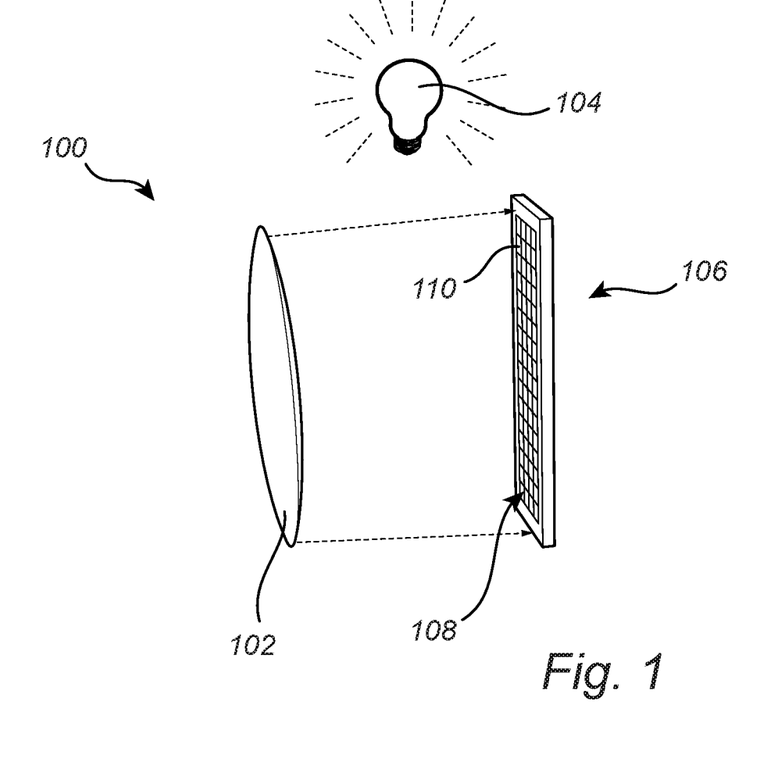
FIG. 1 is a schematic view of system for imaging according to an embodiment.

Referring now to FIG. 1, a system 100 for imaging is illustrated. The system 100 may comprise an optical system 102, which may comprise a plurality of lenses, apertures, filters and other optical components for forming an image onto an image plane. The optical system 102 may be dynamically controlled in order to adapt the system 100 e.g. to different distances between an object that is to be imaged and the system 100.

The system 100 may also comprise an illumination source 104, which provides a known spectral profile of illumination onto the object that is being imaged. Alternatively, the system 100 may use an external illumination source, such as by imaging an object under sunlight illumination.

The system 100 may be adapted to a known spectral profile of the illumination source 104, regardless whether the illumination source is part of the system 100 or not.

The system 100 may comprise an imaging sensor 106, which may be mounted in the system 100 in relation to the optical system 102 such that the imaging sensor 106 may be arranged in an image plane formed by the optical system 102.

The imaging sensor 106 may be based on a complementary metal-oxide-semiconductor (CMOS) structure. The CMOS structure may comprise an array 108 of light-detecting elements 110 and may further comprise circuitry e.g. for reading out detected light intensities in the light-detecting elements 110 and for timing accumulation of light in the light-detecting elements. The CMOS structure may also comprise circuitry for processing the detected light intensities, such as analog-to-digital converters (ADC) and/or other processing components. The CMOS structure may thus provide a possibility of detecting light intensities and outputting an image representation, e.g. in the form of digital values of the light intensities detected by each light-detecting element 110 in the array 108.

The light-detecting elements 110 may be arranged to accumulate charges in dependence of light incident on the light-detecting element 110. The light-detecting element 110 may thus comprise e.g. a photodiode or a photo-transistor.

The array 108 may comprise identical light-detecting elements 110 which are arranged in rows and columns in order to form a two-dimensional array 108. The CMOS structure comprising the array 108 may thus be relatively simple and may also be useful for a number of different applications. This implies that chips carrying the array 108 with an associated read-out and control circuitry may be manufactured in large volumes and may therefore be very cheap. Thus, the imaging sensor 106 may advantageously be formed based on a mass-manufactured CMOS structure.

The array 108 with associated circuitry may be formed on a substrate, wherein desired functionality of the CMOS structure may be achieved by forming a plurality of layers on the substrate. A thickness of the substrate may then be reduced, such that illumination may fall on the light-detecting elements 110 through the substrate, so-called backside illumination. This implies that the light will not need to pass layers arranged on the CMOS structure e.g. for readout and, hence, losses of light due to reflections or absorptions in such layers may be avoided. Thus, backside illumination may provide a possibility to detect as much light as possible, enabling imaging with a high quality.

Based on the CMOS structure, the imaging sensor 106 may be specifically adapted with respect to acquiring images with a spectral resolution. The imaging sensor 106 may be arranged to detect intensity of light in a plurality of different wavelength intervals and may further be arranged such that light within a wavelength interval is detected by the imaging sensor 106 so as to enable differentiating between varying intensities of light within the wavelength interval over a large span of varying intensities, as will be further described below.

Figure 2:
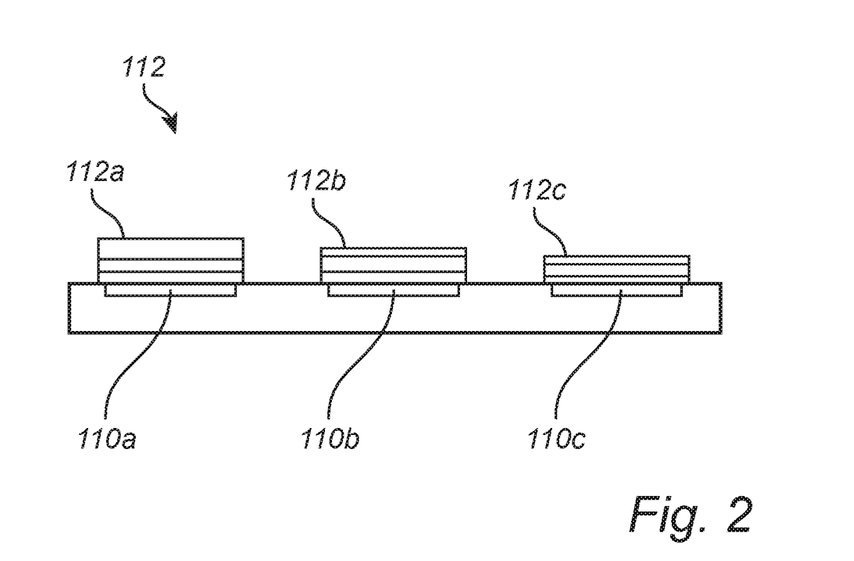
FIG. 2 is a schematic view of a filter arranged in relation to light-detecting elements.

Referring now to FIG. 2, the imaging sensor 106 may thus be provided with a filter 112 arranged on the array 108 of light-detecting elements 110, e.g. on a front-side of the CMOS structure or a back-side of the CMOS structure depending on whether front side or backside illumination is used. As illustrated for a plurality of adjacent light-detecting elements 110*a-c* in FIG. 2, the filter 112 may comprise separate filter portions 112*a-c* with an individual filter portion for each light-detecting element 110. This implies that the light-detecting element 110*a-c* will be arranged to detect a wavelength interval defined by the filter portion 112*a-c*.

The imaging sensor 106 may be provided with filters in a mosaic configuration, wherein the imaging sensor 106 is divided into identical sub-groups of light-detecting elements 110 repeated over the array 108 of light-detecting elements 110 and wherein a filter 112 is provided with filter portions 112*a-c* such that a unique wavelength band is transmitted to each light-detecting element 110 in the sub-group. Thus, each image point (made up by a single sub-group) of an image acquired by the imaging sensor 106 has a spectral resolution defined by the wavelength bands detected in the sub-group. For instance, each sub-group could be formed by 2×2 or 3×3 light-detecting elements in order to detect four or nine different wavelength bands, respectively.

The filter portions may be provided as interference filters, wherein a constructive interference of a specific wavelength allows the specific wavelength to be transmitted through the filter portion. This implies that a narrow wavelength band may be transmitted through the filter portion to the light-detecting element 110. Also, by changing for instance a thickness or a material of a layer in the interference filter, a wavelength that is transmitted may be changed. Thus, the filter portions may be used for selectively choosing the wavelength bands that are detected by the light-detecting elements 110 associated with the filter portions. According to one embodiment, the interference filters are provided as Fabry-Perot filters.

It should be realized that a filter 112 may be associated with the array 108 of light-detecting elements 110 in a different manner. The filter portions may for instance not be arranged in a mosaic configuration, such that adjacent light-detecting elements 110 may instead detect a common wavelength band. In such case, the filter 112 may not need to have very small, separately defined filter portions, which makes manufacture of the filter 112 easier. For instance, the filter 112 may be arranged in a tiled configuration, where each tile defines a wavelength band and covers a group of light-detecting elements 110 within the array 108. The filter 112 may comprise interference filters which may define the wavelength bands detected in the respective tiles. However, since the tiles may be relatively large, other filter implementations may also be used, such as using materials or combination of materials being arranged to transmit specific wavelength intervals.

The tiled configuration may be used in a system 100 comprising an optical duplicator, which is arranged to duplicate an image of an object onto several different portions (tiles) of the imaging sensor 106. Thus, each tile may acquire an image of the object in a unique wavelength band and the spectral resolution of the imaging sensor is defined by the wavelength bands of the different tiles.

The filter 112 may according to another alternative be arranged in a different manner to the array 108 of light-detecting elements 110, while providing a fixed relationship between the filter 112 and the array 108. Thus, the filter 112 need not necessarily be arranged on the same surface as the array 108 of light-detecting elements 110. According to one embodiment, the filter 112 may be mounted in a common housing with the array 108 of light-detecting elements 110, wherein the filter 112 is arranged with a fixed relationship to the array 108 through the mounting of the array 108 and the filter 112 in the common housing. The arrangement of the filter 112 in relation to the array 108 may define the wavelength intervals being detected by the respective light-detecting elements 110 of the array 106.

According to another embodiment, the system 100 may comprise another optical component for controlling a wavelength of light being detected by the light-detecting elements 110. For instance, the system 100 may comprise a grating, which may direct light in different directions depending on the wavelength. Thus, the grating may control the wavelength being detected by the respective light-detecting element 110.

As described above, the imaging sensor 106 may thus be arranged to detect a plurality of different wavelengths and an image acquired by the imaging sensor 106 may thus have a spectral resolution and the imaging sensor 106 may be set up such that the wavelength interval being detected by each light-detecting element 110 is well-defined.

Figure 3:
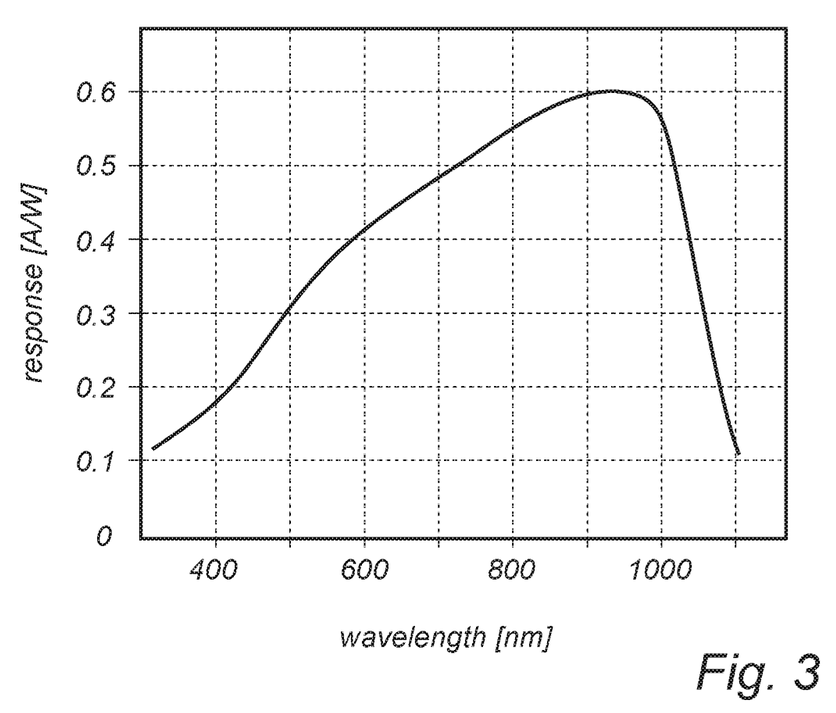
FIG. 3 is a graph of spectral response of a light-detecting element in dependence of wavelength of light.

A spectral response of a light-detecting element 110 may not be the same for different wavelengths. As illustrated by the graph in FIG. 3, showing an electrical current induced in a photodiode based on a light intensity of 1 W, the sensitivity of a photodiode to incident light may be highly dependent on the wavelength of light.

A variability in sensitivity limits a possibility to acquire images with same SNR, spatial resolution, contrast and/or dynamic range in all spectral bands using a same exposure time. With short exposure times, the SNR, spatial resolution, contrast and dynamic range of the image is higher in the spectral bands where the sensitivity is high as small differences in light intensity may be better differentiated and only a small light intensity is required in order for a signal to be above a noise floor. With long exposure times, the SNR, spatial resolution, contrast and dynamic range improves in the spectral bands with low sensitivity, but the spatial resolution and contrast decreases in the spectral bands with high sensitivity because of saturation in the light-detecting elements 110.

The system 100 may be set up for imaging using a known illumination source 104, whereby a spectral profile, i.e. a light intensity per wavelength, of the illumination source 104 may be known. The illumination source 104 may be part of the system 100 or may be a known external source, such as sunlight. The sensitivity of the light-detecting elements 110 and the intensity of light of the illumination source 104 may provide knowledge of the SNR variability over different wavelengths.

It may be desired to obtain images using a constant sensitivity, such that information in different wavelength intervals in the image has a common SNR, spatial resolution, contrast and/or dynamic range. For instance, when detecting light of different wavelength intervals, it may be desired that a high SNR, spatial resolution, contrast and/or dynamic range is provided for each wavelength interval.

The light-detecting elements 110 of the array 108 may be equal in size. This may be advantageous since it provides that manufacture of the CMOS structure may be simple and cheap. Hence, with such a set-up, the imaging sensor 106 may need to be adapted in order to provide a constant SNR, spatial resolution, contrast and/or dynamic range for different wavelengths.

Figure 4A:
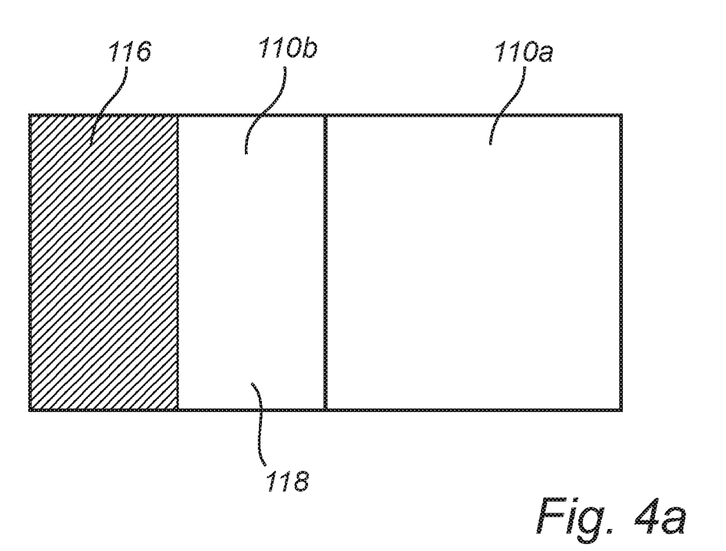
FIGS. 4a-b are schematic views of adapting a fill factor of a light-detecting element to a sensitivity for the wavelength detected by the light-detecting element.
Figure 4B:
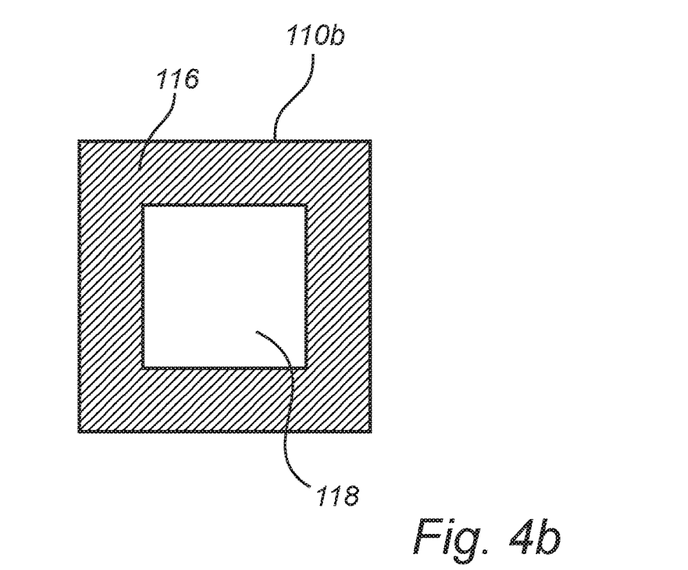

As illustrated in FIG. 4, a variation of a fill factor of light-detecting elements 110 used for detecting each wavelength interval may be used. To equalize the response over all wavelength intervals, the fill factor devoted to wavelength intervals with high sensitivity is reduced while the fill factor devoted to wavelength intervals with low sensitivity is kept as high as possible.

The fill factor is modified by changing an area of the light-detecting elements 110 that will receive incident light, using a pattern 114. The pattern 114 may be arranged integrated on the array 108 of light-detecting elements 110 and may be arranged to block light from reaching a light-detecting element 110.

The pattern 114 may be designed to maximize an area of the light-detecting element 110*a* which is arranged to detect a wavelength interval with low sensitivity. The pattern 114 may further be designed to reduce an area of a light-detecting element 110*b* which is arranged to detect a wavelength interval with high sensitivity.

The use of the pattern 114 may diminish the risk of saturation in wavelength intervals with high sensitivity. Further, use of the pattern 114 also allows controlling the SNR, spatial resolution, contrast and/or dynamic range over a total range of wavelengths spanning the wavelength intervals of the array 108 of light-detecting elements 110 by changing (increasing) the exposure time. This implies that the control of the sensitivity allows improving a SNR, spatial resolution, contrast and/or dynamic range of the imaging sensor 106.

The pattern 114 may define a blocking area 116 which blocks light from reaching the light-detecting element 110 and a transparent area 118 which allows light to pass through the pattern 114 to the light-detecting element 110.

The blocking area 116 and the transparent area 118 may occupy different parts of the light-detecting element, as illustrated in FIG. 4*a*. Here, the blocking area 116 may be associated with a left edge of the light-detecting element 110*b* and the transparent area 118 may be associated with a right edge of the light-detecting element 110*b*. As also shown in FIG. 4*a*, a light-detecting element 110*a* which has a low sensitivity may have a transparent area 118 of the pattern 114 associated with the entire light-detecting element 110*a*.

According to an alternative, the blocking area 116 may be arranged along edges of the light-detecting element 110*a*, defining a transparent area 118 over a central portion of the light-detecting element 110*a*.

It should be realized that other shapes or arrangements of the blocking area 116 and the transparent area 118 in relation to the light-detecting element 110*a* may be contemplated. For instance, the blocking area 116 may be over a central portion of the light-detecting element 110*a*. Also, the blocking area 116 and the transparent area 118 need not have square or rectangular shapes, but any other shape may be contemplated, such as triangular or circular or more complex shapes. Furthermore, the blocking area 116 and/or the transparent area 118 over a light-detecting element 110 may be divided into two or more disjoint portions. For instance, a central blocking portion may be surrounded by a frame forming a transparent area 118, which may in turn be surrounded by a peripheral blocking portion, such that the central and peripheral blocking portions may together form a blocking area 116 associated with the light-detecting element 110.

The pattern 114 may define different sizes of the blocking area 116 for light-detecting elements 110, such that the size of the blocking area 116 of each light-detecting element 110 may be adapted to the wavelength interval detected by each light-detecting element 110, based on the sensitivity of the light-detecting element 110 in the wavelength interval and an intensity of light of the illumination source 104 in the wavelength interval.

According to an embodiment, the blocking areas 116 of the pattern 114 are interconnected and the pattern 114 further defines separate transparent areas 118 separated by portions of the blocking areas 116. Thus, the pattern 114 may be formed by lines of blocking material, which may be arranged on edges of the light-detecting elements 110.

The pattern 114 may be formed by standard deposition and etching techniques for semiconductor manufacturing for creating the shapes of the blocking areas 116. The pattern 114 may further define transparent areas 118 as openings between the blocking areas 116 created by deposition and etching of material on the array 108 of light-detecting elements 110.

The pattern 114 may alternatively be formed by use of at least two different materials in one or more layers for defining the blocking areas 116 in material(s) preventing light to reach the light-detecting elements 110 and transparent areas 118 in material(s) transmitting light to the light-detecting elements 110.

The blocking area 116 may be formed from one or more materials which are arranged to substantially or completely block light of the respective wavelength interval from reaching the light-detecting element 110. All blocking areas 116 may be formed from the same material, which should then block light in all wavelengths for which the light-detecting elements 110 detect light. The blocking areas 116 could for instance be formed from a metal or any other material known to the person skilled in the art having desired optical properties. The material may be suitable for use in semiconductor manufacturing processes and may be arranged to block light by absorption and/or reflection over a broad range of wavelengths.

The transparent area 118 may be defined as openings between blocking areas 116. Alternatively, the transparent area 118 may be formed from one or more materials which are arranged to transmit light of the respective wavelength interval to the light-detecting element 110. The transparent area 118 may for instance be formed from a semiconductor material or any other material known to the person skilled in the art having desired optical properties. The material may be suitable for use in semiconductor manufacturing processes and may be at least substantially transparent over a broad range of wavelengths.

The pattern 114 may be arranged on the filter 112. This implies that the imaging sensor 106 may be arranged on a single chip, wherein the wavelength being detected by each light-detecting element 110 is accurately controlled and a size of the area of each light-detecting element 110 that receives light is also accurately controlled.

The imaging sensor 106 need not necessarily comprise equal numbers of light-detecting elements 110 for each wavelength interval. For instance, sensitivity of the light-detecting elements 110 for certain wavelengths may be substantially lower than for other wavelengths. This may also be compensated for by using more light-detecting elements 110 for the wavelength intervals of very low sensitivity.

Figure 5A:
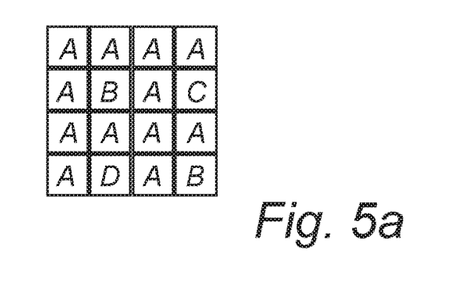
FIGS. 5a-b are schematic views of arrangements of a pattern in relation to an array of light-detecting elements.
Figure 5B:
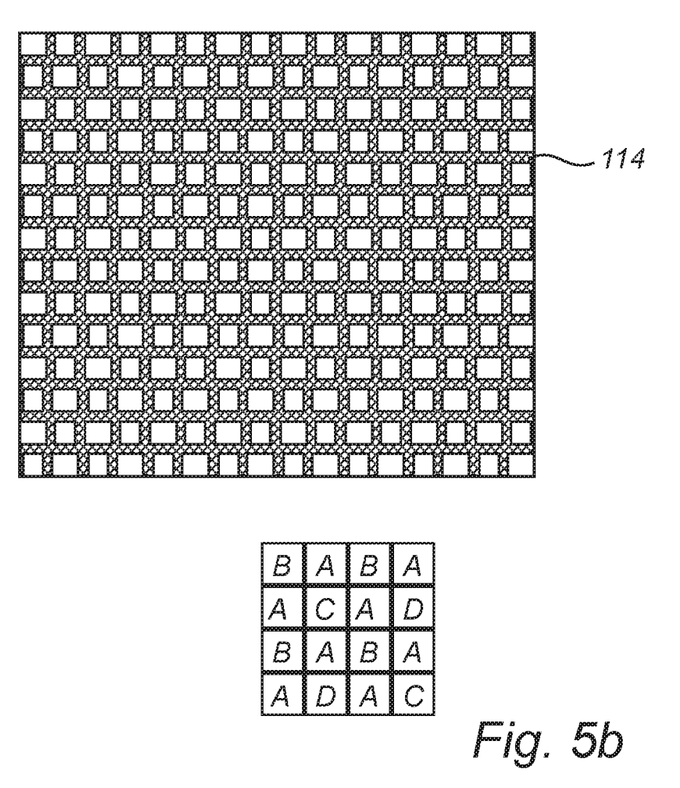

In FIGS. 5a-b, two different layouts of filters in relation to light-detecting elements 110 is illustrated. In the lower left corner of each figure, the layout of the filter 112 is indicated, wherein letters "A", "B", "C" and "D" are chosen to each indicate a unique wavelength interval being transmitted by the respective filter portions. For instance, "A" could correspond to the light-detecting element 110 detecting ultraviolet or near-infrared radiation, whereas "B", "C", and "D" could correspond to the light-detecting element 110 detecting green, blue, or red light, respectively. As shown in FIG. 5a, where all light-detecting elements 110 in every other row will be arranged to detect radiation as defined by filter "A", the blocking areas 116 may be formed mainly in relation to the other rows having light-detecting elements 110 with higher sensitivity. On the other hand, as shown in FIG. 5b, wherein the light-detecting elements 110 for different wavelength intervals are intermixed, the blocking areas 116 form a grid with varying sizes of the transparent areas 118.

The system 100 for imaging may be especially advantageously used in applications wherein the illumination source 104 will always have the same spectral profile. Thus, the system 100 may be suitable for use in remote sensing applications, such as satellite- or aircraft-based imaging, wherein sunlight will be used as the illumination source. Also, the system 100 may be suitable for use in endoscopic applications, wherein a known illumination source 104 part of the system 100 may be used.

In addition to or alternatively to equalizing of a SNR, spatial resolution, contrast and/or dynamic range for the light-detecting elements 110 of the array 108, the pattern 114 may be arranged to address vignetting effects. i.e. that a brightness of an acquired image is reduced at edges of the image due to light being incident on the imaging sensor 106 at different angles. The light-detecting elements 110 may be more sensitive to light rays that are on-axis or close to parallel to the optical axis for a number of reasons: the light rays have travelled a short distance; light rays fall onto a small spot in the image plane (at edges of the array 108, the light rays may graze the image plane and spread over a large area); the light rays are not affected by an aperture in the optical system 102. Further, one or more lenses of the optical system 102 may impact light intensity at edges of the array 108 and further add to a vignetting effect.

Typically, the center of the array 108 may be arranged to coincide with an optical axis of the optical system 102. The blocking area 116 of the pattern 114 may then be arranged to be larger at a center of the array 108 compared to the blocking area 116 at an edge of the array 108. Hence, intensity of light at the center of the array is reduced so that the detected intensity of light by light-detecting elements 110 should not be dependent on a position of the light-detecting element 110 in the array 108.

Further, a position of the blocking area 116 in relation to the light-detecting element 110 may differ depending on the position of the light-detecting element 110 in the array 108. At the center of the array, the smallest angle of light rays incident on the light-detecting element 110 will be at the center of the light-detecting element 110, such that the blocking area 116 may be arranged to cover a center of the light-detecting element 110. However, at an edge of the array 108, the smallest angle of light rays incident on the light-detecting element 110 may be at an edge of the light-detecting element 110 closest to the center of the array 108, such that the blocking area 116 may be asymmetrically arranged in relation to the light-detecting element 110 depending on a distance from the light-detecting element 110 to the center of the array 108.

Further, if the system 100 is to be used in a line-scanning application, where an object or a scenery is arranged to be scanned over rows of the array 108 in order to detect different spectral information of the object from different rows, a varying of a size of the blocking areas in one row may be repeated for other rows in the array 108, as a vignetting effect may be handled row by row. In this case, the rows of the array 108 may extend in a direction perpendicular to a scanning movement direction.

As mentioned above, the pattern 114 may be designed to equalize a SNR, spatial resolution, contrast and/or dynamic range for different wavelengths and to reduce a vignetting effect. Thus, a size of blocking areas 116 and transparent areas 118 may be dependent on both these effects.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. An imaging sensor, comprising:
   an array of light-detecting elements, wherein each light-detecting element in the array of light-detecting elements is arranged in the imaging sensor so as to detect a respective wavelength interval, wherein the respective wavelength interval differs for different light-detecting elements;
   a pattern arranged on the array of light-detecting elements,
   wherein the pattern defines a plurality of transparent areas, each transparent area being associated with a corresponding light-detecting element in the array of light-detecting elements,
   wherein a size in a lateral direction of a transparent area among the plurality of transparent areas is dependent on the corresponding light-detecting element with which the transparent area is associated,
   wherein the sizes of at least two transparent areas among the plurality of transparent areas are different from each other, and
   a filter positioned between the pattern and the array of light-detecting elements for controlling the respective wavelength interval being detected by the light-detecting elements.

2. The imaging sensor according to claim 1, wherein the sizes of each of the plurality of transparent areas are dependent on a sensitivity of the corresponding light-detecting element to the respective interval of wavelengths detected by the light-detecting element.

3. A system for imaging, comprising:
   an optical system for forming an image onto an image plane; and
   an imaging sensor according to claim 2, the imaging sensor arranged in the image plane to acquire an image of an object.

4. The imaging sensor according to claim 1, wherein a first light-detecting element having a smallest sensitivity for the respective interval of wavelengths is used for defining a maximum size of the transparent area of the pattern, and wherein the transparent areas of other light-detecting elements are smaller than the maximum size and designed in relation to an imaging parameter for the first light-detecting element.

5. A system for imaging, comprising:
   an optical system for forming an image onto an image plane; and
   an imaging sensor according to claim 4, the imaging sensor arranged in the image plane to acquire an image of an object.

6. The imaging sensor according to claim 1, wherein the pattern comprises blocking areas between the transparent areas, wherein a blocking area at least partially overlaps a light-detecting element so as to limit a portion of the light-detecting element which will receive light through the pattern.

7. The imaging sensor according to claim 6, wherein the blocking areas of the pattern are interconnected and the pattern further defines separate transparent areas separated by portions of the blocking areas, wherein each separate transparent area is arranged on the corresponding light-detecting element.

8. The imaging sensor according to claim 6, wherein the transparent areas of the pattern are interconnected and the pattern further defines separate blocking areas separated by portions of the transparent areas, wherein each separate blocking area is arranged on the corresponding light-detecting element.

9. The imaging sensor according to claim 6, wherein the blocking areas are formed of a material which is opaque to wavelengths of light over a total range of wavelengths spanning the wavelength intervals of the array of light-detecting elements.

10. A system for imaging, comprising:
    an optical system for forming an image onto an image plane; and
    an imaging sensor according to claim 6, the imaging sensor arranged in the image plane to acquire an image of an object.

11. The imaging sensor according to claim 1, wherein the filter comprises Fabry-Perot optical filters being selective to a narrow wavelength interval, wherein a Fabry-Perot optical filter is arranged on each of the light-detecting elements.

12. The imaging sensor according to claim 1, wherein the filter defines a large number of different wavelength intervals, such as at least four or at least eight, to be detected by the light-detecting elements.

13. The imaging sensor according to claim 1, wherein the imaging sensor is arranged for backside illumination.

14. The imaging sensor according to claim 1, wherein the pattern defines a blocking area corresponding to each light-detecting element, and wherein the blocking area is arranged to block light rays incident on the light-detecting element at smallest angles in relation to a normal to the light-detecting element and wherein a size of the blocking area is dependent of the corresponding light-detecting element with which the blocking area is associated.

15. A system for imaging, comprising:
    an optical system for forming an image onto an image plane; and
    an imaging sensor according to claim 1, the imaging sensor arranged in the image plane to acquire an image of an object.

16. The system according to claim 15, wherein the sizes of the transparent areas of the imaging sensor are designed in relation to a spectral profile of an illumination source.

17. Use of an imaging sensor according to claim 1 for acquiring an image having a constant imaging parameter over a range of wavelengths spanning the wavelength intervals of the light-detecting elements.

18. The imaging sensor according to claim 1, wherein the pattern defines varying sizes of the plurality of transparent areas.

19. A system for imaging, comprising:
    an optical system for forming an image onto an image plane; and an imaging sensor according to claim 18, the imaging sensor arranged in the image plane to acquire an image of an object.

\* \* \* \* \*